(12) United States Patent
Compter et al.

(10) Patent No.: US 6,646,721 B2
(45) Date of Patent: Nov. 11, 2003

(54) LITHOGRAPHIC PROJECTION APPARATUS POSITIONING SYSTEM, METHOD OF MANUFACTURING, DEVICE MANUFACTURED THEREBY AND COMPUTER PROGRAM

(75) Inventors: Johan C Compter, Eindhoven (NL); Petrus C. M. Frissen, Beek (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/098,612

(22) Filed: Mar. 18, 2002

(65) Prior Publication Data

US 2002/0145722 A1 Oct. 10, 2002

(30) Foreign Application Priority Data

Mar. 20, 2001 (EP) .............................................. 01302573

(51) Int. Cl.[7] ........................ G03B 27/58; G03B 27/42; G03B 27/62; G03B 27/32
(52) U.S. Cl. .............................. 355/72; 355/53; 355/75; 355/77
(58) Field of Search .............................. 355/53, 72, 75, 355/77

(56) References Cited

U.S. PATENT DOCUMENTS

| | | | |
|---|---|---|---|
| 4,535,278 A | 8/1985 | Asakawa | 318/687 |
| 4,888,543 A * | 12/1989 | Bleijenberg | 318/721 |
| 5,172,160 A * | 12/1992 | Van Eijk et al. | 355/53 |
| 5,204,712 A * | 4/1993 | Bouwer et al. | 355/53 |
| 5,815,246 A * | 9/1998 | Sperling et al. | 355/53 |
| 6,285,097 B1 * | 9/2001 | Hazelton et al. | 310/12 |
| 6,437,463 B1 * | 8/2002 | Hazelton et al. | 310/12 |

FOREIGN PATENT DOCUMENTS

| JP | 10-178798 | 6/1998 |
|---|---|---|
| WO | WO 00/10058 | 2/2000 |

OTHER PUBLICATIONS

European Search Report for Application No. 01302573.9–1240, dated Sep. 25, 2001.

\* cited by examiner

*Primary Examiner*—Rodney Fuller
(74) *Attorney, Agent, or Firm*—Pillsbury Winthrop LLP (57) ABSTRACT

A lithographic apparatus has a positioning system for positioning an object table. The positioning system includes a planar motor having a stator and a translator, one comprising a periodic magnet structure and the other comprising a plurality of coils. The phase relationship between the stator and translator is determined by energizing at least some of the coils with an oscillating signal sufficient to cause vibrations of the translator, measuring the vibrations, and determining the phase relationship between the translator and stator on the basis of the measured vibrations. Alternatively, the relationship between stator and translator may be determined by detecting distinct optical marks on the periodic magnet array.

36 Claims, 4 Drawing Sheets

LITHOGRAPHIC PROJECTION APPARATUS POSITIONING SYSTEM, METHOD OF MANUFACTURING, DEVICE MANUFACTURED THEREBY AND COMPUTER PROGRAM

This application claims priority from EP 01302573.9 filed Mar. 20, 2001, herein incorporated by reference.

FIELD

The invention relates generally to lithographic apparatus and more particularly to methods of aligning planar motors used in a lithographic projection apparatus.

BACKGROUND

In general, a lithographic apparatus comprises a radiation system to supply a projection beam of radiation, a support structure to support patterning structure, the patterning structure serving to pattern the projection beam according to a desired pattern, a substrate table to hold a substrate, and a projection system to project the patterned beam onto a target portion of the substrate.

The term "patterning structure" as here employed should be broadly interpreted as referring to structure or means that can be used to endow an incoming radiation beam with a patterned cross section, corresponding to a pattern that is to be created in a target portion of the substrate; the term "light valve" can also be used in this context. Generally, the said pattern will correspond to a particular functional layer in a device being create d in the target portion, such as an integrated circuit or other device (see below). Examples of such patterning structure include:

- A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.
- A programmable mirror array. An example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described hereabove, the patterning structure can comprise one or more programmable mirror arrays. More information on such mirror arrays can be gleaned, for example, from United States Patents U.S. Pat. No. 5,296,891 and U.S. Pat. No. 5,523,193, which are incorporated herein by reference. In the case of a programmable mirror array, the said support structure may be embodied as a frame or table, for example, which may be fixed or movable as required.
- A programmable LCD array. An example of such a construction is given in United States Patent U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning structure as hereabove set forth.

Lithographic projection apparatus can be used, for example, in the manufacture of integrated circuits (ICs). In such a case, the patterning structure may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at one time; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual lithographic apparatus are described, for example, in U.S. Pat. No. 5,969,441 and WO 98/40791, incorporated herein by reference.

In lithographic apparatus, planar motors have been proposed for use in positioning systems for the object tables, especially the substrate table. A suitable planar motor for positioning the substrate table(s) comprises a so-called "checker-board" of magnets over which a coil unit (sometimes also referred to as an armature or translator) moves in response to the forces exerted on it as the coils are energized. The checker-board, forming the stator of the motor, comprises rows and columns of magnets forming a square array; each magnet generates a vertical magnetic field but the directions alternate. Referring to the checker board analogy, the black squares, say, are magnets with a north pole uppermost and the white squares are magnets with a south pole uppermost. The stator may also include further magnets, generating fields in the plane of the board, arranged in between the rows and columns of the primary magnets. These further magnets can be arranged to enhance the field generated by the primary magnets and also to provide levitation forces to form a bearing for the coil unit.

Unlike a simple rotary motor, the magnitude and direction of the force exerted by a planar motor in response to a given energizing current depends on the physical position of the translator coil(s) relative to the periodic magnet structure in the stator, which may be referred to as the translator phase position. Thus to determine the energizing current to be applied to the coil(s) to generate a desired force, it is necessary to know the translator phase position. In a lithographic apparatus, the position of a table, e.g. the substrate table, is conventionally measured using interferometric displacement measuring means which are exceptionally accurate, have large operating ranges and have very fast response times. However, most positioning systems have fine and coarse positioning units and the interferometers are used to measure the position of the fine stage relative to the projection lens, which is mounted on a reference frame isolated from the rest of the apparatus and particularly the positioning systems. Thus, the stage position as measured by the interferometer is not very useful in measuring the position of a translator of a planar motor used in the coarse positioning unit relative to a stator mounted to the main frame of the apparatus.

To determine the relative position of the translator and stator it is therefore necessary to provide an additional position sensor. Movements of the translator can be conveniently measured by an optical encoder but such a device measures only displacements and requires to be initialized. To determine the initial position it is possible to provide an additional position measuring system capable of directly measuring the absolute position of the table. (Such a system may not be suitable for measuring the position of the table throughout its range of movement due to a limited measurement range or slow response speed.) Alternatively, a physical stop can be provided at an extreme of the range of movement of the table—the table is then driven against the stop from its initial unknown position. When movement of the table ceases it is known to be hard up against the stop, defining its position. The provision of an additional absolute position measuring system incurs additional expense and occupies space which can be at a premium in a lithographic apparatus. Repeatedly driving the table against a physical stop causes contamination, undesirable wear and shock to the table.

EP-0 297 642-A1 describes a method of alignment of a linear or rotary motor of the synchronous type in which the relations between the driving forces of the motor and the energizing currents in the phase windings are periodic functions of the rotor or translator position and that has an incremental encoder for measuring displacements of the rotor or translator. The method involves generating measuring currents in different phase windings in turn to produce vibration in the rotor or stator and determines the position of the rotor or translator from the amplitude of the induced vibrations.

SUMMARY

In an aspect of at least one embodiment of the present invention, there is provided a method of determining the initial position of the moving part of a planar motor in a lithographic projection apparatus.

At least one embodiment of the present invention includes a lithographic apparatus comprising a radiation system for supplying a projection beam of radiation, a support structure for supporting patterning structure, the patterning structure serving to pattern the projection beam according to a desired pattern, a substrate table for holding a substrate, a projection system for projecting the patterned beam onto a target portion of the substrate, first control means for energizing a plurality of said energizable coils in turn with an oscillating signal sufficient to cause vibrations of said translator having an amplitude less than the period of said periodic magnet structure, vibration measuring means for measuring said vibrations of said translator, and second control means for determining the phase relationship between said translator and said stator on the basis of said measured vibrations.

According to at least one embodiment of the present invention, there is also provided a positioning system for positioning an object, said positioning system comprising: a planar motor having a stator and a translator, one of said stator and said translator comprising a periodic magnet structure and the other of said stator and said translator comprising a plurality of energizable coils; a first control means for energizing a plurality of said energizable coils in turn with an oscillating signal sufficient to cause vibrations of said translator having an amplitude less than the period of said periodic magnet structure; a vibration measuring means for measuring said vibrations of said translator; and a second control means for determining the phase relationship between said translator and said stator on the basis of said measured vibrations.

According to at least one embodiment of the present invention, there is further provided a device manufacturing method using a lithographic projection apparatus comprising a radiation system for providing a projection beam of radiation, a support structure for supporting patterning structure, the patterning structure serving to pattern the projection beam according to a desired pattern, a substrate table for holding a substrate, a positioning system for positioning at least one of said support structure and said substrate table, said positioning system comprising a planar motor having a stator and a translator, one of said stator and said translator comprising a periodic magnet structure and the other of said stator and said translator comprising a plurality of energizable coils, a projection system for projecting the patterned beam onto a target portion of said substrate; the method comprising: providing a substrate that is at least partially covered by a layer of radiation-sensitive material; providing a projection beam of radiation using a radiation system; using patterning structure to endow the projection beam with a pattern in its cross-section; projecting the patterned beam of radiation onto a target portion of the layer of radiation-sensitive material; energizing a plurality of said energizable coils in turn with an oscillating signal sufficient to cause vibrations of said translator having an amplitude less than the period of said periodic magnet structure; measuring said vibrations of said translator; and determining the phase relationship between said translator and said stator on the basis of said measured vibrations.

According to at least one embodiment of the present invention, there is also provided a lithographic projection apparatus comprising: a radiation system for providing a projection beam of radiation; a support structure for supporting patterning structure, the patterning structure serving to pattern the projection beam according to a desired pattern; a substrate table for holding a substrate; a positioning system for positioning at least one of said support structure and said substrate table, said positioning system comprising a planar motor having a stator and a translator, one of said stator and said translator comprising a periodic magnet structure and the other of said stator and said translator comprising a plurality of energizable coils; a projection system for projecting the patterned beam onto a target portion of said substrate; an array of optically detectable marks on the magnet structure; an optical detecting means for detecting the array of distinct optical marks; and a control means for determining the relative position of the stator and translator on the basis of the detected distinct optical marks.

Although specific reference may be made in this text to the use of the apparatus according to at least one embodiment of the present invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm), as well as particle beams, such as ion beams or electron beams.

In the description below, reference is made to an orthogonal X, Y, Z coordinate system of which the Z direction may be referred to as vertical. However, this should not be taken as requiring a specific orientation of the apparatus. The notation $R_i$ is used to denote rotation about an axis parallel to the I direction.

BRIEF DESCRIPTION OF THE DRAWINGS

The present invention will be further described below, by way of example only, with reference to the accompanying schematic drawings, in which like reference numerals indicate like parts, and in which.

DETAILED DESCRIPTION OF THE DRAWINGS

Figure 1:
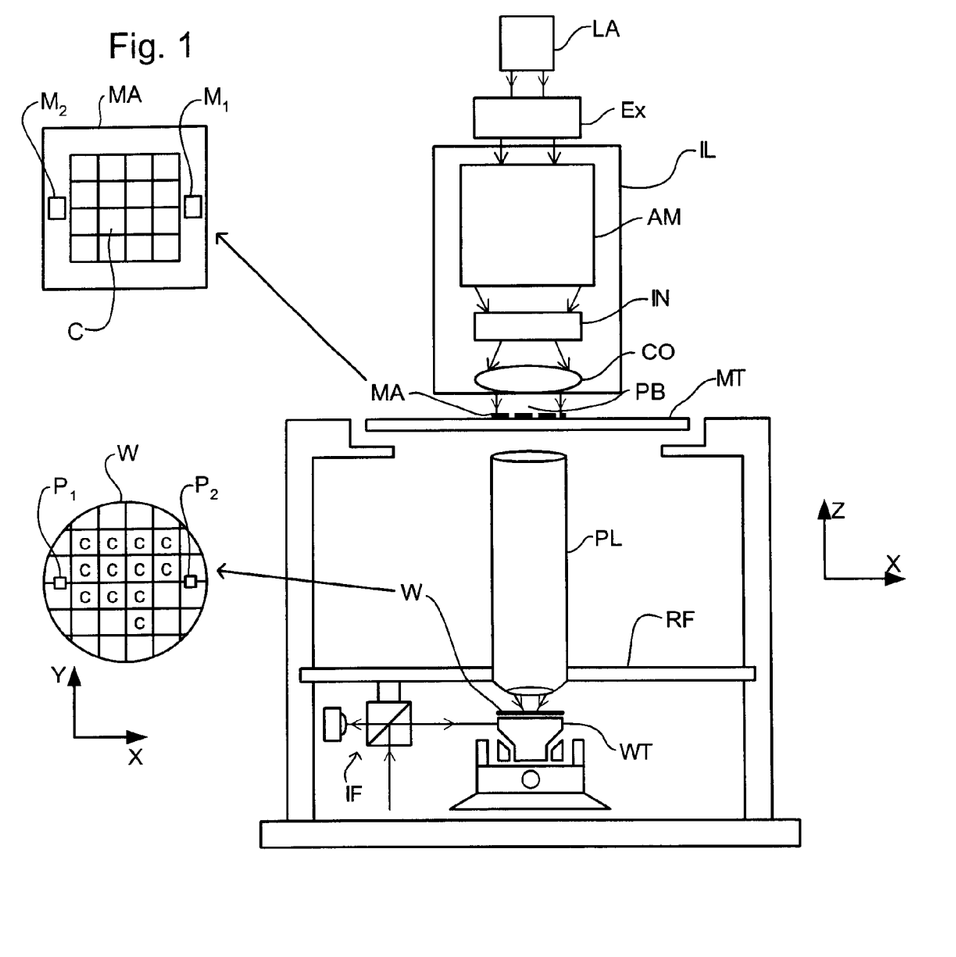
FIG. 1 depicts a lithographic projection apparatus according an embodiment of the present invention.

FIG. 1 schematically depicts a lithographic projection apparatus according to at least one embodiment of the present invention. The apparatus comprises:

a radiation system Ex, IL, for supplying a projection beam PB of radiation (e.g. ultraviolet radiation with a wavelength of 157 or 126 nm). In this particular case, the radiation system also comprises a radiation source LA;

a first object table (mask table) MT provided with a mask holder for holding a mask MA (e.g. a reticle), and connected to first positioning means for accurately positioning the mask with respect to item PL;

a second object table (substrate table) WT provided with a substrate holder for holding a substrate W (e.g. a resist-coated silicon wafer), and connected to second positioning means for accurately positioning the substrate with respect to item PL;

a projection system ("lens") PL (e.g. a refractive lens system) for imaging an irradiated portion of the mask MA onto a target portion C (e.g. comprising one or more dies) of the substrate W.

As here depicted, the apparatus is of a transmissive type (i.e. has a transmissive mask). However, in general, it may also be of a reflective type, for example, with a reflective mask. Alternatively, the apparatus may employ another kind of patterning structure, such as a programmable mirror array of a type as referred to above.

The source LA (e.g. a Hg lamp or an excimer laser) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The present invention encompasses at least both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed.

The depicted apparatus can be used in two different modes:

1. In step mode, the mask table MT is kept essentially stationary, and an entire mask image is projected at one time (i.e. a single "flash") onto a target portion C. The substrate table WT is then shifted in the x and/or y directions so that a different target portion C can be irradiated by the beam PB;
2. In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
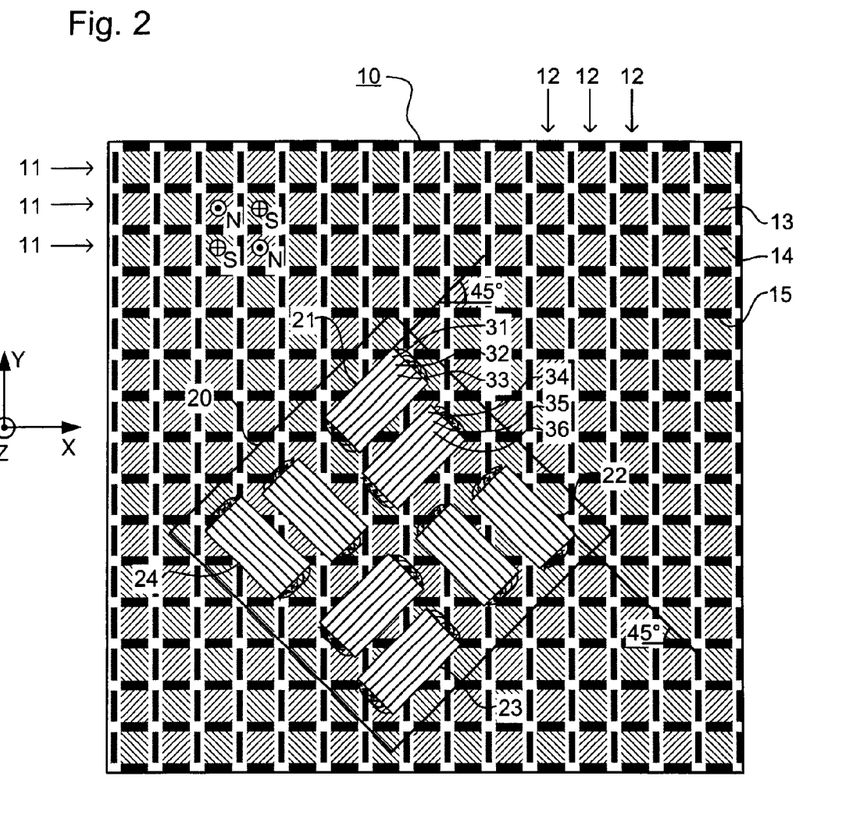
FIG. 2 is a plan view of a planar motor used in the positioning system for the substrate stage of the apparatus of FIG. 1.

According to at least one embodiment of the present invention, the second positioning means, which positions the substrate table WT, employs a planar motor as shown in FIG. 2. The planar motor comprises a stator 10 supported by the base frame or base plate of the lithographic apparatus and a translator 20 mechanically coupled to the substrate table WT. The stator 10 is supported by a flexible support to allow for movement in the X, Y direction and minimize any bouncing between the stator 10 and the substrate table WT. The substrate table WT may be directly mounted to the translator 20 or mounted on a member, e.g. a beam, which is connected to one or more planar motors. Such an arrangement may be useful where the substrate table is kept in a vacuum chamber and the beam is used to transmit driving forces to the table from a planar motor outside the vacuum chamber. Indirect connection between the planar motor and substrate table can allow the substrate table to be provided, for example, with an air foot to support its own weight avoiding the need to provide sufficient levitation forces in the planar motor to support the whole substrate table.

As can be seen in FIG. 2, the stator 10 comprises a square array formed by rows 11 and columns 12 of square (in plan) primary magnets 13, 14. The primary magnets 13, 14 generate a vertical magnetic field (parallel to the Z direction) in the space immediately above the stator 10 and are of two sets. One set of primary magnets, referenced 13, generate a magnetic field I in the positive Z direction and the second set of primary magnets, referenced 14, generate a magnetic field in the negative Z direction. The magnets 13 of the first set may be regarded as having a north pole (N) uppermost and the magnets 14 of the second set as having a south pole (S) uppermost. The two sets of magnets 13, 14 alternate along the rows 11 and columns 12 to form a checker-board type pattern.

Between the rows and columns 11, 12, secondary magnets 15 are provided. The secondary magnets 15 are rectangular in plan with their longest dimension equal in length and parallel to the adjacent side of the adjacent primary magnet. The smaller dimension is in the range of ¼ to ½ of the length of the side of the primary magnets. The magnet field generated by the secondary magnets is horizontal and directed towards the nearest one of the first set of primary magnets 13, i.e. the nearest magnet with a north pole uppermost. This means that the secondary magnets 15 that are positioned between the rows 11, and which therefore have their longest dimension parallel to the X axis, generate a magnetic field in the positive or negative Y direction, while those between the columns 12 generate a magnetic field in the positive or negative X direction. Along each row or column of secondary magnets 15, the directions of the fields generated by the secondary magnets 15 alternate.

The fields generated by the primary magnets 13, 14 are acted against to provide the motive force when the coils of the translator 20 are energized, whilst the secondary magnets 15 enhance the field generated by the primary magnets 13, 14 above the magnets.

Translator 20 has mounted on it four coil units 21, 22, 23, 24; two of the coil units 21, 23 are oriented at +45° to the X direction and two 22, 24 at −45°. Each coil unit 21, 22, 23, 24 comprises two sets of three coils 31, 32, 33 and 34, 35, 36. Each of the coils has two long conductors 31a, 31b, etc. which are parallel and of length substantially equal to an even multiple of the pole pitch of the primary magnets. (The pole pitch of the primary magnets is defined as the distance between two parallel lines connecting the centers of diagonally adjacent magnets of the two types.) The two conductors, which are referred to below as the forward conductor and the return conductor, of each coil are spaced apart by a distance substantially equal to the pole pitch of the primary magnets, whilst the three forward conductors and the three return conductors of the three coils in one set are spaced apart by approximately one third the pole pitch. The two sets of coils in each coil unit are staggered in the longitudinal direction by approximately one half of the pole pitch to reduce variation in the forces generated as the translator unit moves across the stator.

Figure 3:
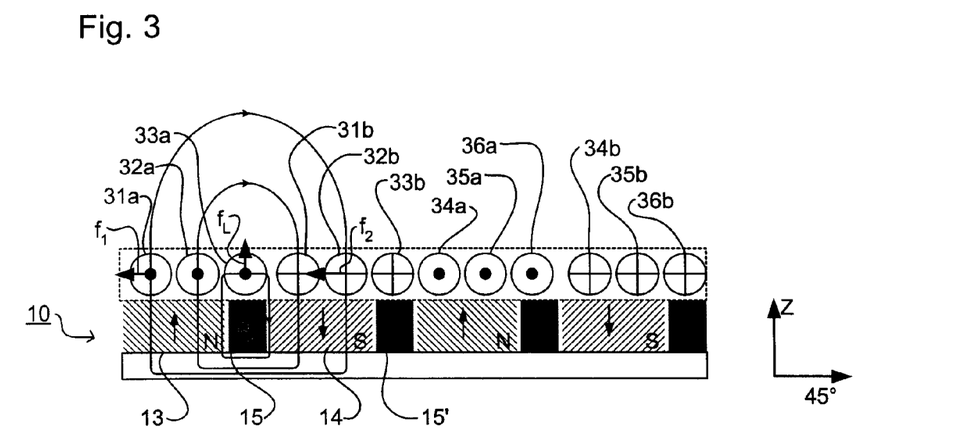
FIG. 3 is a partial cross-sectional view of the planar motor of FIG. 2.

The generation of motive forces is shown in FIG. 3, which is a cross-section through coil unit 21 along a line perpendicular to the forward and return conductors 31a, 31b, etc. and so at 45° to the X and Y directions.

When the translator 20 is in the position shown in FIG. 3, the forward conductor 31a of coil 31 is above a primary magnet 13 of the first set, which generates a magnetic field directed in the positive Z direction. If the forward conductor 31a carries an energizing current flowing out of the page, as shown, then the resultant force $f_L$ on forward conductor 31a will be leftwards, as shown. Forward conductor 32a will also experience a leftward force as it has a current in the same direction as forward conductor 31a and also lies in the magnetic field of primary magnet 13. Forward conductor 33a, however, lies in the magnetic field generated by primary magnet 13 and secondary magnet 15 and its current, out of the page, causes a force $f_L$ in the Z direction to be exerted on it. When the stator 10 of the planar motor is horizontal, the force $f_L$ acts vertically and serves to levitate the translator. It is therefore referred to as the levitation force and can be used to provide a bearing between stator and translator.

Because the return conductors 31b, 32b, 33b are spaced apart from the corresponding forward conductors 31a, 32a, 33a by substantially the primary magnet pitch (defined above), they lie in magnetic fields of opposite direction. Return conductors 31b, 32b lie in the magnetic field generated by primary magnet 14 while return conductor lies in the magnetic field of secondary magnet 15' which is oriented oppositely to secondary magnet 15. Since the currents in the return conductors 31b, 32b, 33b are also oppositely directed as compared to those in the forward conductors 31a, 32a, 33a, the forces on the return conductors are the same as those on the corresponding forward conductors.

It will be appreciated that if energizing current in the coils is constant, then as the translator is moved leftwards from the position shown in FIG. 3 and return conductor 31b moves into the magnetic field generated by secondary magnet 15, the force exerted on it will be downwards. Thus to maintain the levitation force, the direction of the energizing currents in the coils must be reversed in synchronism with the movement of the coils over the magnets of the stator. Because the three coils are spaced apart by a distance substantially equal to one third of the primary coil pitch, the points at which the energizing currents in the three coils must be reversed are 120° apart, where a complete cycle of 360° represents movement of the translator by a distance in the X or Y direction equal to twice the column or row spacing. However, to do that it is necessary to know the relative position, or phase, of the translator 20 relative to stator 10.

To determine the relative phase of the translator 20 and stator 10, the following procedure is applied. The coils 31 to 36 in coil units 21 to 24 are energized in turn with an oscillating test signal having a small amplitude and short period chosen to cause the translator 20 to perform small oscillations about its original position. The period of the energizing test signal must be shorter, preferably substantially shorter, than the time that would be taken for the translator to move a distance equal to the row or column pitch under the motive power of the maximum force exerted on the coil as a result of the oscillating test signal.

As will be appreciated, the amplitude, phase and direction of the vibrations induced in the translator 20 as a result of the application of the oscillating test signal to a given coil will depend on the relative position and orientation of that coil relative to the magnets of the stator 10. By measuring and comparing the vibrational responses as the coils are energized in turn enables the position of the translator 20 relative to the stator 10 to be determined.

The method is preferably applied to each degree of freedom of the planar motor sequentially or serially. If done sequentially, it is convenient to begin by applying the method to the Z-direction.

Once the phase relationship between stator and translator has been determined, the translator can be energized to move it to a predetermined position where a position sensor is provided to make a more accurate determination of the position of the translator.

In some applications, depending on the desired accuracy of the position determination, it may be desirable to apply the oscillating test signal to each of the coils of each coil unit 21 to 24 and measure all parameters of the resulting vibrations, however in other applications it may suffice to apply the test signal to only one or two coils in each coil unit and make fewer measurements of the resulting vibrations.

Depending on the uniformity of the magnets (their strength and size) and the layout of the stator, it may be possible to determine the absolute position of the translator or only its phase relationship to the stator. Where the stator magnet system is precisely periodic, only a phase relationship can be determined. However, if there are variations in the strength or periodicity of the magnetic fields generated by the stator and these are suitably mapped in advance, it may be possible to determine the exact relative position of the translator relative to the stator. In a lithographic projection apparatus, the stator magnet system is generally as uniform as possible; determination of the absolute position of the translator can be performed using other means.

By energizing coils of the planar signal with a relatively small amplitude and short period signal, the translator is caused to vibrate about its initial position without actually translating. The amplitude and direction of the vibrations caused by the known test signal when applied to a coil indicate the motor response for that coil at the initial position and hence the phase relationship between that coil and the periodic magnet structure. Applying the test signal to multiple coils gives multiple measurements which can be related using the known motor-response/phase-relationship and known physical positions of the different coils to determine the position of the translator relative to the stator. Accordingly, only the addition of control electronics or software, which need not occupy any space near the positioning system and avoids inflicting additional shocks or wear on the object table, is required.

Figure 4:
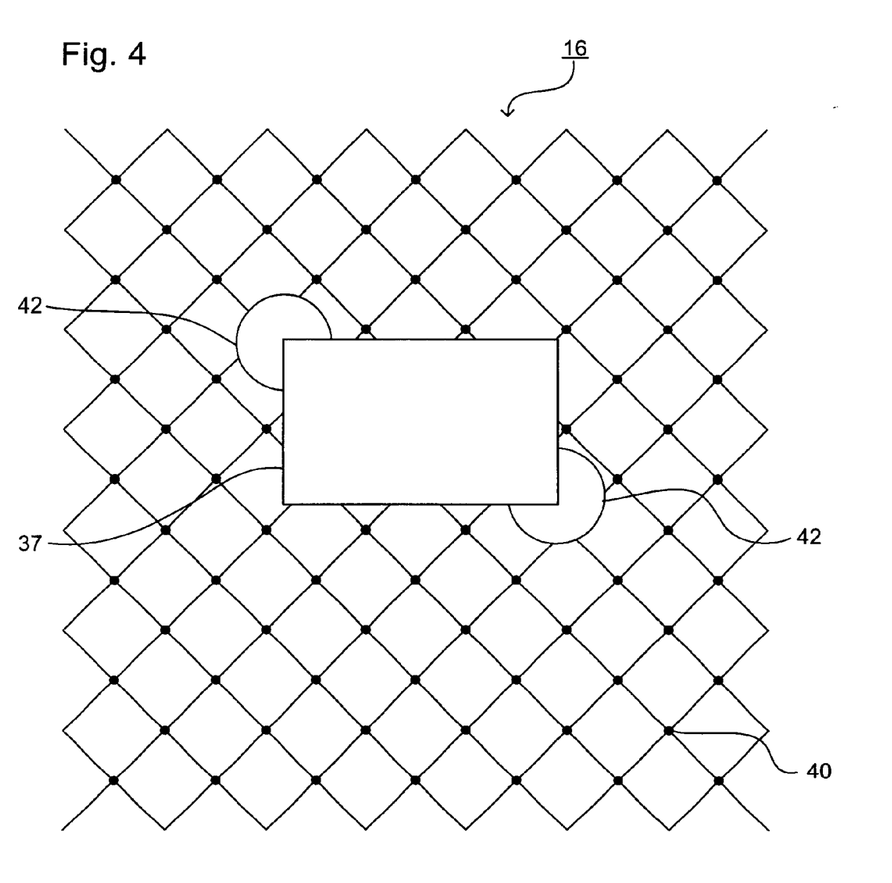
FIG. 4 is a plan view of the planar motor and optical marks according to an embodiment of the present invention.

In at least one embodiment of the present invention, referring to FIG. 4, an optical detector is used to determine the position of the coil unit 37 relative to the magnet array with reference to a set of optically detectable markers 40 provided on the periodic magnet structure 16. The optically detectable marks are periodic and distinct, for example dots or distinctive line types. The periodicity of the optically detectable marks 40 can be related to the periodicity of the periodic magnet structure 16.

The optical detector is a camera attached to the plurality of energizable coils 37, arranged such that the periodic magnet structure 16 is perpendicular to the line of view of the camera, and the camera has an uninhibited view of at least some of the optically detectable marks 40. In this example, the camera has a relatively smaller field of view 42 and will be able to view only a small range of the optically detectable marks 40 as shown in FIG. 4. The camera must have a sufficient field of view to always encompass at least one optically detectable mark 40. The camera views one or more of the distinct optical marks and the control means can then determine the position of the coil unit 37 relative to the magnet structure 16. More than one camera can be used, and more than one could be attached to, for example, opposite corners of the plurality of energizable coils 37. Using the information from the two cameras the control means can accurately determine the orientation of the plurality of energizable coils 37.

Figure 5:
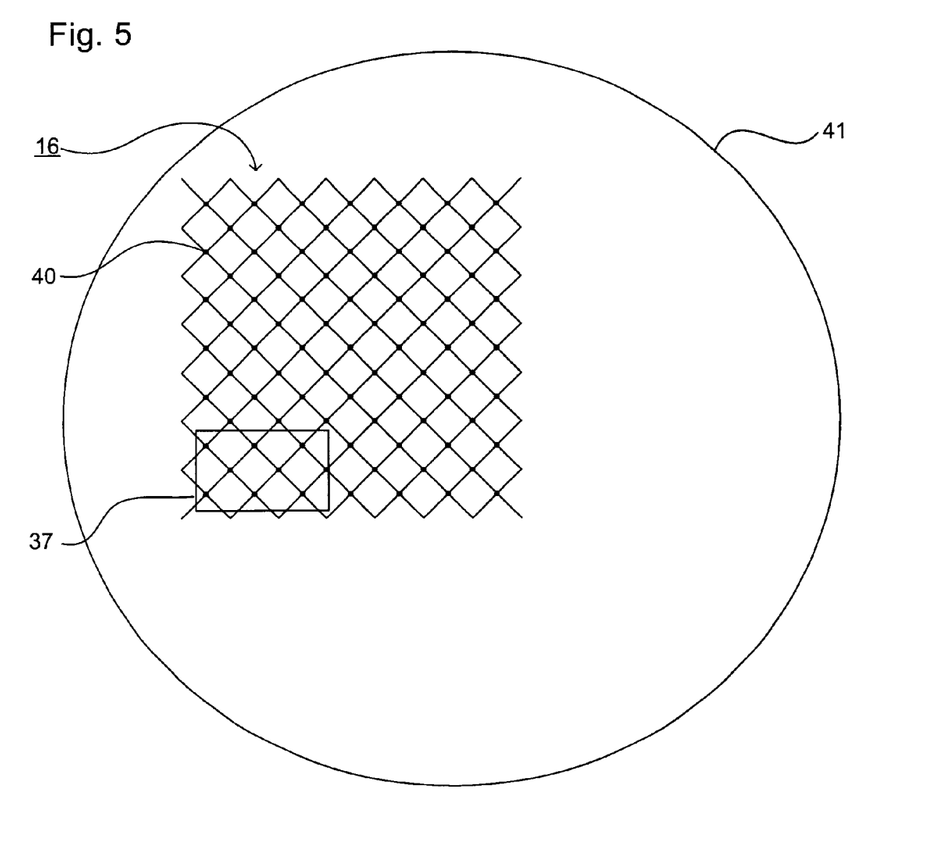
FIG. 5 is the field of view of the camera according to an embodiment of the present invention.

According to at least one embodiment of the present invention, a camera can be mounted on a stationary frame above the stator 10 and translator 20 as shown in FIG. 5. The camera is arranged such that the entire periodic magnet structure 16 is within the field of vision 41 of the camera even when the translator 20 is at the extremities of its range. The plurality of energizable coils 37 cover some of the optically detectable marks 40 and therefore the camera cannot detect these optical marks 40. Using this information the control means determines the position of the translator 20 relative to the stator 10.

The optically detectable marks 40 do not have to be periodic or related to the periodic magnet structure 10 and the optical detecting means is not confined to a camera.

As the optically detectable marks are distinct, those detected by the optical detecting means identify the relative positions of the stator and translator. Accordingly, little space is needed in a lithographic apparatus for appropriate control electronics and software and the need to initialize the device is eliminated.

While specific embodiments of the invention have been described above, it will be appreciated that the invention may be practiced otherwise than as described. The description is not intended to limit the present invention.

What is claimed is:

1. A lithographic projection apparatus comprising:
    a radiation system to provide a projection beam of radiation;
    a support structure to support patterning structure, the patterning structure serves to pattern the projection beam according to a desired pattern;
    a substrate table to hold a substrate;
    a positioning system to position at least one of said support structure and said substrate table, said positioning system comprising a stator and a translator, one of said stator and said translator comprising a periodic magnet structure and the other of said stator and said translator comprising a plurality of coils, said plurality of coils being configured to receive a movement signal to induce movement of said translator in more than one degree of freedom, said plurality of coils being further configured to receive an oscillating signal to induce vibrations of said translator, said vibrations having an amplitude less than the period of said periodic magnet structure;
    a projection system to project the patterned beam onto a target portion of said substrate; and
    a vibration measurer to measure vibrations of said translator in more than one degree of freedom and to determine a phase relationship between said translator and said stator on the basis of said measured vibrations.

2. Apparatus according to claim 1 wherein said vibration measurer measures the amplitude and direction of said vibrations.

3. Apparatus according to claim 1 wherein said vibration measurer measures the phase of said vibrations relative to said oscillating signal.

4. Apparatus according to claim 1 wherein at least some of said plurality of coils which are energized with said oscillating signal are differently oriented.

5. Apparatus according to claim 1 wherein said periodic magnet structure is comprised in said stator and said coils are comprised in said translator.

6. Apparatus according to claim 1 wherein said positioning system comprises a coarse positioning module and a fine positioning module, said planar motor being comprised in said coarse positioning module.

7. Apparatus according to claim 1 wherein said positioning system is for positioning said substrate table.

8. Apparatus according to claim 1 wherein the support structure comprises a mask table to hold a mask.

9. Apparatus according to claim 1 wherein the radiation system includes a radiation source.

10. The lithographic projection apparatus according to claim 1, wherein said vibration measurer is configured to measure vibrations of said translator in at least two orthogonal directions.

11. The lithographic projection apparatus according to claim 1, wherein said plurality of coils is configured to induce vibrations of said translator in at least two orthogonal directions.

12. The lithographic projection apparatus according to claim 1, wherein said plurality of coils is configured to induce movement of said translator in at least three degrees of freedom.

13. The lithographic projection apparatus according to claim 1, wherein the plurality of coils includes coils arranged in a first direction and coils arranged in a second direction different than the first direction, and
    wherein the plurality of coils is configured to receive the oscillating signal only through coils arranged in the first direction.

14. The lithographic projection apparatus according to claim 1, wherein the plurality of coils includes coils arranged in a first direction and coils arranged in a second direction different than the first direction, and
    wherein the plurality of coils is configured to receive the oscillating signal through fewer than all of the coils arranged in the first direction.

15. The lithographic projection apparatus according to claim 1, wherein each of the plurality of coils has a forward conductor and a return conductor, and
    wherein at least one of the plurality of coils is configured to have a return conductor in a different magnetic field polarity than the corresponding forward conductor.

16. The lithographic projection apparatus according to claim 1, wherein each of the plurality of coils has a forward conductor and a return conductor, and
    wherein at least one of the plurality of coils is configured to have a spacing between a forward conductor and the corresponding return conductor at least substantially equal to a distance between a first parallel line connecting the centers of adjacent magnets of the periodic magnet structure of a first orientation and a second parallel line connecting the centers of adjacent magnets of the periodic magnet structure of a second orientation opposite to the first orientation.

17. The lithographic projection apparatus according to claim 1, wherein each of the plurality of coils has a forward conductor and a return conductor, and
    wherein at least one among the plurality of coils has a forward conductor whose length is substantially equal to an even multiple of a distance between a first parallel line connecting the centers of adjacent magnets of the periodic magnet structure of a first orientation and a second parallel line connecting the centers of adjacent magnets of the periodic magnet structure of a second orientation opposite to the first orientation.

18. The lithographic projection apparatus according to claim 1, wherein each of the plurality of coils has a forward conductor and a return conductor, and
    wherein the plurality of coils includes a first coil oriented parallel to a second coil, and wherein the forward conductor of the first coil is closer than the return conductor of the second coil to the forward conductor of the second coil.

19. The lithographic projection apparatus according to claim 1, wherein the periodic magnet structure is periodic in each of at least two orthogonal directions.

20. A positioning system to position an object, said positioning system comprising:
a stator and a translator, one of said stator and said translator comprising a periodic magnet structure and the other of said stator and said translator comprising a plurality of coils, said plurality of coils being configured to receive a movement signal to induce movement of said translator in more than one degree of freedom, said plurality of coils being further configured to receive an oscillating signal to induce vibrations of said translator, said vibrations having an amplitude less than the period of said periodic magnet structure; and
a vibration measurer to measure said vibrations of said translator in more than one degree of freedom and determine a phase relationship between said translator and said stator on the basis of said measured vibrations.

21. The positioning system according to claim 20, wherein said vibration measurer is configured to measure an amplitude and a direction of said vibrations.

22. The positioning system according to claim 20, wherein said plurality of coils is configured to induce movement of said translator in at least three degrees of freedom.

23. The positioning system according to claim 20, wherein the plurality of coils includes coils arranged in a first direction and coils arranged in a second direction different than the first direction, and
wherein the plurality of coils is configured to receive the oscillating signal only through coils arranged in the first direction.

24. The positioning system according to claim 20, wherein each of the plurality of coils has a forward conductor and a return conductor, and
wherein at least one of the plurality of coils is configured to have a spacing between a forward conductor and the corresponding return conductor at least equal to a distance between a first parallel line connecting the centers of adjacent magnets of the periodic magnet structure of a first orientation and a second parallel line connecting the centers of adjacent magnets of the periodic magnet structure of a second orientation opposite to the first orientation.

25. A device manufacturing method using a lithographic projection apparatus, the lithographic apparatus including a positioning system to position at least one of a support structure to support patterning structure and a substrate table, said positioning system comprising a stator and a translator, one of said stator and said translator comprising a periodic magnet structure and the other of said stator and said translator comprising a plurality of coils configured to receive a movement signal to induce movement of said translator in more than one degree of freedom, the method comprising:
providing a substrate that is at least partially covered by a layer of radiation-sensitive material;
providing a projection beam of radiation using a radiation system;
using patterning structure to endow the projection beam with a pattern in its cross-section;
projecting the patterned beam of radiation onto a target portion of the layer of radiation-sensitive material;
applying to a plurality of said coils an oscillating signal sufficient to cause vibrations of said translator in more than one degree of freedom, said vibrations having an amplitude less than the period of said periodic magnet structure;
measuring said vibrations of said translator in more than one degree of freedom; and
determining a phase relationship between said translator and said stator on the basis of said measured vibrations.

26. The device manufacturing method according to claim 25, wherein measuring said vibrations of said translator includes measuring an amplitude and a direction of said vibrations.

27. The device manufacturing method according to claim 25, wherein measuring said vibrations of said translator includes measuring a phase of said vibrations relative to said oscillating signal.

28. The device manufacturing method according to claim 25, wherein measuring said vibrations of said translator includes measuring said vibrations in a least two orthogonal directions.

29. The device manufacturing method according to claim 25, wherein the plurality of coils includes coils arranged in a first direction and coils arranged in a second direction different than the first direction, and
wherein applying an oscillating signal includes applying the oscillating signal only to coils arranged in the first direction.

30. The device manufacturing method according to claim 25, wherein the plurality of coils includes coils arranged in a first direction and coils arranged in a second direction different than the first direction, and
wherein applying an oscillating signal includes applying the oscillating signal to fewer than all of the coils arranged in the first direction.

31. A device manufactured according to a method using a lithographic projection apparatus, the lithographic apparatus including a positioning system to position at least one of a support structure to support patterning structure and a substrate table, said positioning system comprising a stator and a translator, one of said stator and said translator comprising a periodic magnet structure and the other of said stator and said translator comprising a plurality of coils configured to receive a movement signal to induce movement of said translator in more than one degree of freedom, the method comprising:
providing a substrate that is at least partially covered by a layer of radiation-sensitive material;
providing a projection beam of radiation using a radiation system;
using patterning structure to endow the projection beam with a pattern in its cross-section;
projecting the patterned beam of radiation onto a target portion of the layer of radiation-sensitive material;
applying to a plurality of said coils an oscillating signal sufficient to cause vibrations of said translator in more than one degree of freedom, said vibrations having an amplitude less than the period of said periodic magnet structure;
measuring said vibrations of said translator in more than one degree of freedom; and
determining a phase relationship between said translator and said stator on the basis of said measured vibrations.

32. The device according to claim 31, wherein measuring said vibrations of said translator includes measuring an amplitude and a direction of said vibrations.

33. The device according to claim 31, wherein the plurality of coils includes coils arranged in a first direction and coils arranged in a second direction different than the first direction, and wherein applying an oscillating signal includes applying the oscillating signal only to coils arranged in the first direction.

34. A computer program to determine a phase relationship of a stator and a translator in a lithographic projection apparatus, the lithographic projection apparatus including a positioning system to position at least one of a substrate table and a support structure to support patterning structure, said positioning system comprising a stator and a translator, one of said stator and said translator comprising a periodic magnet structure and the other of said stator and said translator comprising a plurality of coils configured to receive a movement signal to induce movement of said translator in more than one degree of freedom, the computer program comprising program code to, when executed on a computer, perform the method of:

applying to a plurality of said coils an oscillating signal sufficient to cause vibrations of said translator in more than one degree of freedom, said vibrations having an amplitude less than the period of said periodic magnet structure;

measuring said vibrations of said translator in more than one degree of freedom; and determining a phase relationship between said translator and said stator on the basis of said measured vibrations.

35. The computer program according to claim 34, wherein measuring said vibrations of said translator includes measuring an amplitude and a direction of said vibrations.

36. The computer program according to claim 34, wherein the plurality of coils includes coils arranged in a first direction and coils arranged in a second direction different than the first direction, and wherein applying an oscillating signal includes applying the oscillating signal only to coils arranged in the first direction.

* * * * *